United States Patent
Hsu et al.

(10) Patent No.: US 11,502,096 B2
(45) Date of Patent: Nov. 15, 2022

(54) MEMORY DEVICE CAPABLE OF IMPROVING ERASE AND PROGRAM EFFICIENCY

(71) Applicant: eMemory Technology Inc., Hsin-Chu (TW)

(72) Inventors: Chia-Jung Hsu, Hsinchu County (TW); Wein-Town Sun, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 17/393,413

(22) Filed: Aug. 4, 2021

(65) Prior Publication Data

US 2022/0052064 A1 Feb. 17, 2022

Related U.S. Application Data

(60) Provisional application No. 63/065,512, filed on Aug. 14, 2020.

(51) Int. Cl.
| | | |
|---|---|---|
| *G11C 16/14* | (2006.01) | |
| *H01L 27/11558* | (2017.01) | |
| *H01L 27/11519* | (2017.01) | |
| *G11C 16/04* | (2006.01) | |
| *H01L 27/11521* | (2017.01) | |
| *G11C 16/26* | (2006.01) | |
| *G11C 16/30* | (2006.01) | |
| *H02M 3/07* | (2006.01) | |

(52) U.S. Cl.
CPC ...... *H01L 27/11558* (2013.01); *G11C 16/045* (2013.01); *G11C 16/14* (2013.01); *G11C 16/26* (2013.01); *G11C 16/30* (2013.01); *H01L 27/11519* (2013.01); *H01L 27/11521* (2013.01); *H02M 3/073* (2013.01)

(58) Field of Classification Search
CPC ....... G11C 16/045; G11C 16/14; G11C 16/26; G11C 16/30; G11C 5/145; H01L 27/11558; H01L 27/11519; H01L 27/11521; H02M 3/073; H02M 3/07
USPC .................................. 365/185.05, 185.11
See application file for complete search history.

(56) References Cited

U.S. PATENT DOCUMENTS 7,983,081 B2 7/2011 Fang
2007/0045767 A1* 3/2007 Zhu ..................... H01L 29/1087
257/E29.183

(Continued)

FOREIGN PATENT DOCUMENTS

TW I353056 11/2011

*Primary Examiner* — Michael T Tran
(74) *Attorney, Agent, or Firm* — Winston Hsu

(57) ABSTRACT

A memory device includes a first well, a second well, a first active area, a second active area, a third active area, a first poly layer and a second poly layer. The first well is of a first conductivity type. The second well is of a second conductivity type different from the first conductivity type. The first active area is of the second conductivity type and is formed on the first well. The second active area is of the first conductivity type and is formed on the first well and between the first active area and the second well. The third active area is of the first conductivity type and is formed on the second well. The first poly layer is formed above the first well and the second well. The second poly layer is formed above the first well.

14 Claims, 5 Drawing Sheets

(56) References Cited

U.S. PATENT DOCUMENTS

| | | | |
|---|---|---|---|
| 2009/0267127 A1* | 10/2009 | Chen | H01L 27/11521 257/314 |
| 2010/0006138 A1* | 1/2010 | Rao | H01L 31/02021 257/369 |
| 2010/0148238 A1* | 6/2010 | Wang | H01L 27/11558 438/266 |
| 2010/0214839 A1* | 8/2010 | Guzzi | H01L 27/11524 257/314 |
| 2012/0037971 A1* | 2/2012 | Kwon | H01L 27/11521 257/E29.345 |
| 2013/0286718 A1* | 10/2013 | Krilic | G11C 5/148 365/154 |
| 2014/0293709 A1 | 10/2014 | Kwon | |
| 2015/0091080 A1* | 4/2015 | Sun | G11C 16/26 257/326 |
| 2016/0093607 A1* | 3/2016 | Luan | G11C 11/4113 257/370 |
| 2016/0190208 A1* | 6/2016 | Nazarian | G11C 13/003 438/238 |
| 2019/0157298 A1* | 5/2019 | Huo | H01L 27/11548 |
| 2020/0006363 A1 | 1/2020 | Hsu | |
| 2020/0395476 A1* | 12/2020 | Su | H01L 21/02381 |
| 2022/0208246 A1* | 6/2022 | Choi | G11C 11/4096 |

\* cited by examiner

MEMORY DEVICE CAPABLE OF IMPROVING ERASE AND PROGRAM EFFICIENCY

CROSS REFERENCE TO RELATED APPLICATIONS

This application claims priority to provisional Patent Application No. 63/065,512, filed Aug. 14, 2020, and incorporated herein by reference in its entirety.

BACKGROUND OF THE INVENTION

1. Field of the Invention

The present invention is related to a memory device, and more particularly, a memory device capable of improving erase and program efficiency and reduce size.

2. Description of the Prior Art

As the demand for data storage increases, the importance of memory device also rises. Based on current technique, it is a challenge to overcome the following problems.

Regarding program operation, the transistor of the memory device must be turned on to generate a current. However, after being turned off during the erase operation, it is often difficult to smoothly turn on the transistor, and hence the "stuck-bit" problem often occurs. A soft-program operation using band-to-band tunneling hot-electron (BBHE) can be used to better turn on the transistor for preventing the stuck-bit problem; however, the soft-program operation often induce disturbances and excessive operating time.

In addition, in order to isolate the noisy signals, some users like to build the memory structure on an isolation layer such as a barrier layer or a deep well. However, during the erase operation, the high erase voltage often causes junction breakdown. The concentration of the layer between the doped region (for receiving the erase voltage) and the isolation layer can be reduced to better avoid junction breakdown; however, this makes the erase voltage punch through the structure from the doped region to the isolation layer. Hence, it is often not allowed to build the device on the isolation layer, and this makes it more difficult to isolate noises.

Further, according to the current structure, during the erase operation, the electrons are pulled out from the floating gate to the doped region close to the floating gate. However, since the floating gate often blocks doping when manufacturing the doped region, the overlapped area of the doped region and the floating gate is very limited, or the doped region and the floating gate are not overlapped at all. In other words, only the edge F-N (Fowler-Nordheim) tunneling mechanism can be used, hence the efficiency of erase operation is highly limited.

Moreover, according to the current structure, a well layer must be used to block the punch-through current. This well layer cannot be shrunken or omitted for complying with design rules and blocking the punch-through current, and this often leads to excessive device size.

SUMMARY OF THE INVENTION

An embodiment provides a memory device including a first well, a second well, a first active area, a second active area, a third active area, a first poly layer and a second poly layer. The first well is of a first conductivity type. The second well is of a second conductivity type different from the first conductivity type. The first active area is of the second conductivity type and is formed on the first well. The second active area is of the first conductivity type and is formed on the first well and between the first active area and the second well. The third active area is of the first conductivity type and is formed on the second well. The first poly layer is formed above the first well and the second well. The second poly layer is formed above the first well. A first overlap area of the first poly layer and the second active area is smaller than a second overlap area of the first poly layer and the third active area.

These and other objectives of the present invention will no doubt become obvious to those of ordinary skill in the art after reading the following detailed description of the preferred embodiment that is illustrated in the various figures and drawings.

DETAILED DESCRIPTION

In the text, when a first element (hereinafter A) is described to be disposed or formed on an element B (hereinafter B), it means A can be disposed or formed on the surface of B, or A can be partially or totally embedded inside B. When A is described to be disposed or formed in B, it means A can be embedded inside B. In the text, the term poly can mean polycrystalline silicon. In the text, when a first value (hereinafter X) is described to be substantially equal to a second value (hereinafter Y), the difference of X and Y is not larger than 15% of each of X and Y. In the text, when A is described to be overlapped with B, it means A and B can be partially or completely overlapped with one another. In the text, the voltage values and time lengths described are mere examples to help those skilled in the art comprehend the embodiments.

Figure 1:
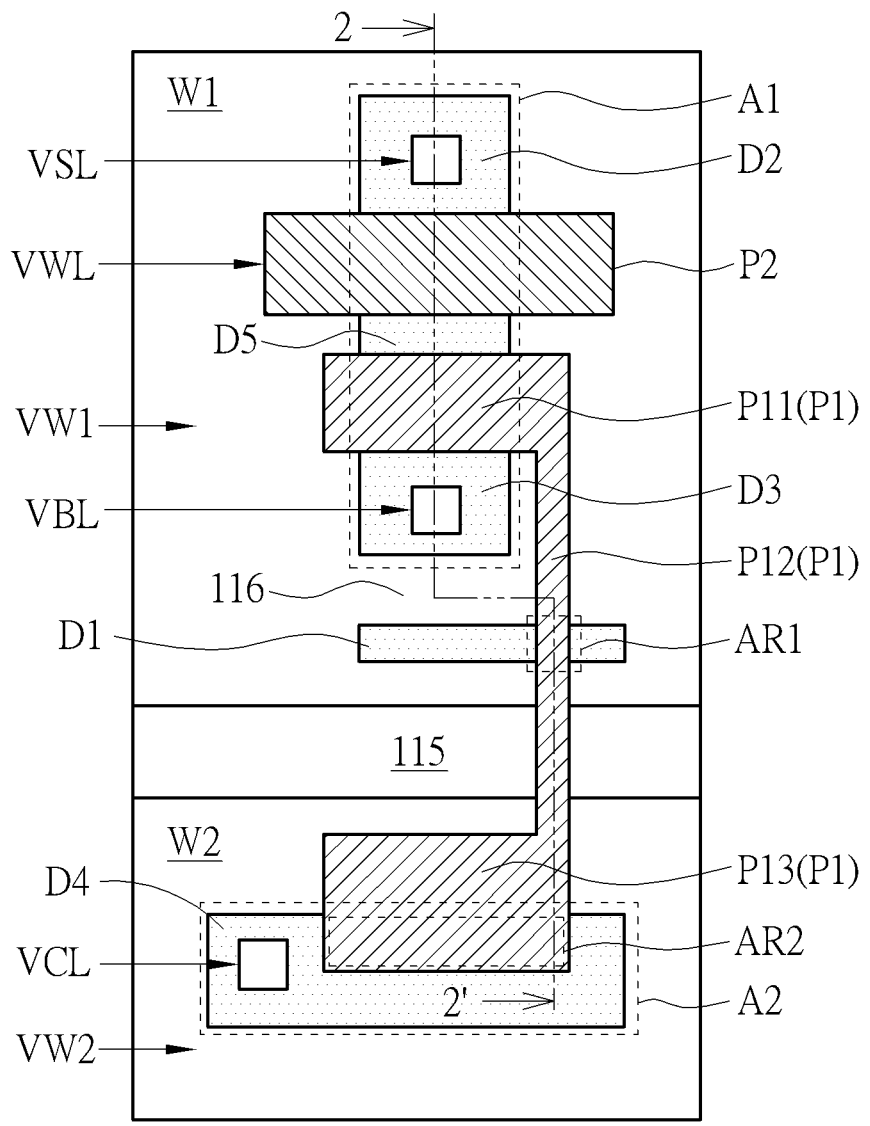
FIG. 1 illustrates a top view of a memory device according to an embodiment.
Figure 2:
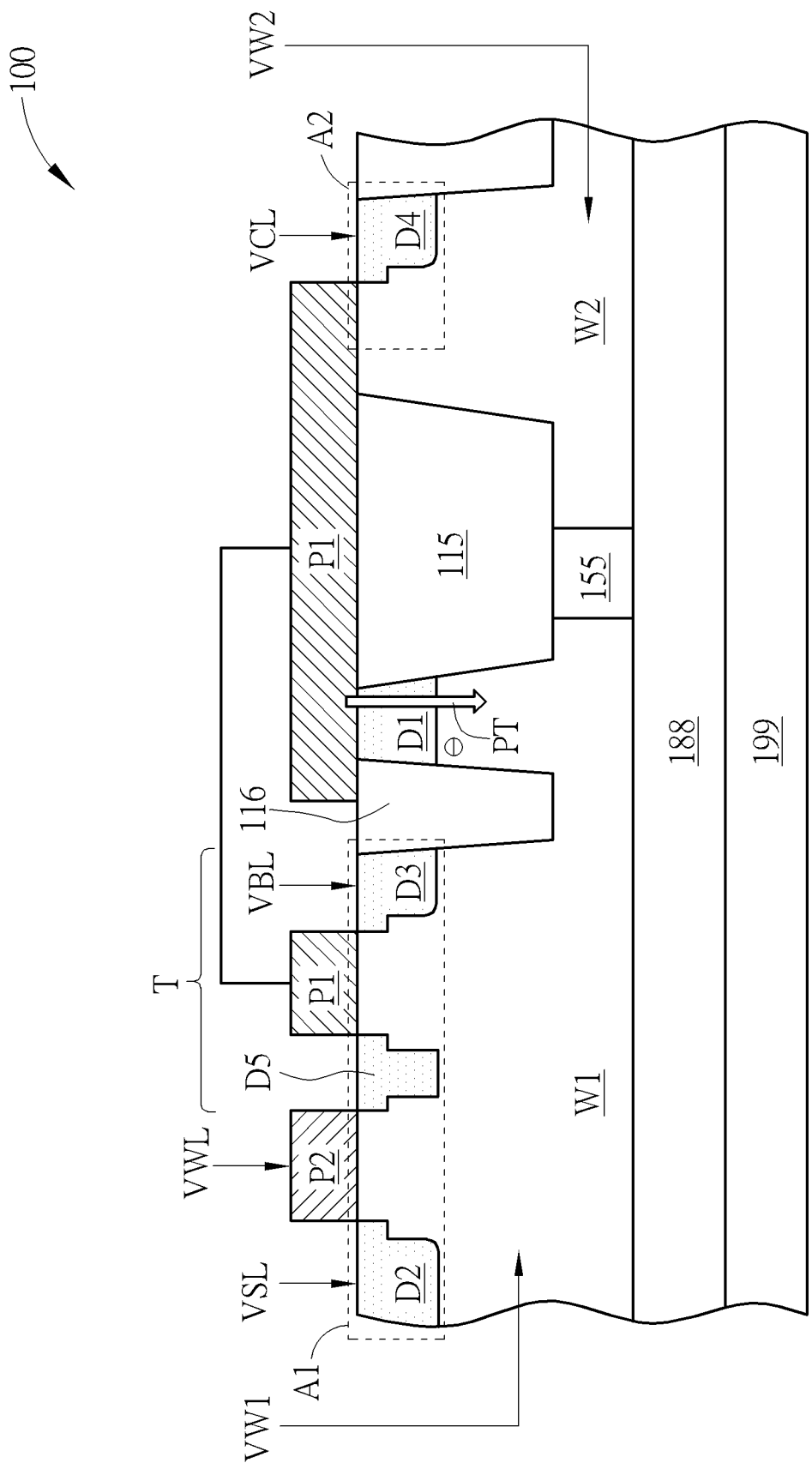
FIG. 2 illustrates a cross-sectional view of the memory device of FIG. 1 cutting along line 2-2'.

FIG. 1 illustrates a top view of a memory device 100 according to an embodiment. FIG. 2 illustrates a cross-sectional view of the memory device 100 of FIG. 1 cutting along line 2-2'. As shown in FIG. 1 and FIG. 2, the memory device 100 can include a first well W1, a second well W2, an active area A1, an active area D1, an active area A2, a first poly layer P1 and a second poly layer P2. As shown in FIG. 1, since the sectional line is not straight, two portions of the poly layer P1 are connected with a line in FIG. 2 to express the electrical connection.

The well W1 can be of a first conductivity type, and the well W2 can be of a second conductivity type different from the first conductivity type. For example, the first conductivity type and the second conductivity type can be respectively n-type and p-type.

The active area A1 can be of the second conductivity type and formed on the well W1. The active area D1 can be of the first conductivity type and formed on the well W1 and between the active area A1 and the well W2. The active area A2 can be of the first conductivity type and formed on the well W2. The poly layer P1 can be formed above the well W1 and the well W2. The poly layer P2 can be formed above the well W1.

As shown in FIG. 1, a first overlap area AR1 of the poly layer P1 and the active area D1 can be smaller than a second overlap area AR2 of the poly layer P1 and the active area A2.

As shown in FIG. 1 and FIG. 2, the active area A1 can include a doped region D2, a doped region D3 and a doped region D5 of the second conductivity type. The active area A2 can include a doped region D4 of the first conductivity type.

For example, the doped region D2 can be coupled to a source line of the memory device 100 and receive a source line voltage VSL. The doped region D3 can be coupled to a bit line of the memory device 100 and receive a bit line voltage VBL. The doped region D4 can be used to receive a couple line voltage VCL. The poly layer P2 can form a select gate coupled to a word line of the memory device 100 and receive a word line voltage VWL. The well W1 (e.g., an n-well) can receive a voltage VW1, and the well W2 (e.g., a p-well) can receive a voltage VW2. The voltages will be described below in Table-1 regarding the operations such as program, erase and read.

As shown in FIG. 2, the memory device 100 can further include an isolation layer 188. The isolation layer 188 can be formed below the well W1 and the well W2 and used to isolate external signals. For example, the isolation layer 188 can include a buried layer of the first conductivity type/the second conductivity type (e.g., an n-type buried layer/a p-type buried layer), an epitaxial layer (a.k.a. epi layer) of the second conductivity type (e.g., a p-type epitaxial layer), a deep well of the first conductivity type/the second conductivity type (e.g., a deep n-type well/a deep p-type well) and/or a substrate of the second conductivity type (e.g., a p-type substrate).

As shown in FIG. 2, the memory device 100 can further include a substrate 199. The substrate 199 can be of the second conductivity type and formed below the isolation layer 188. For example, the substrate 199 can be a p-type substrate. In FIG. 2, the substrate 199 and the isolation layer 188 are below other layers since FIG. 2 merely shows a part of the structure, and other layers can be surrounded by the isolation layer 188 and the substrate 199 from the bottom and sides.

As shown in FIG. 2, the memory device 100 can optionally include a middle substrate layer 155. The middle substrate layer 155 can be of the second conductivity type, formed between the well W1 and the well W2 and used to increase a junction breakdown voltage between the well W1 and the well W2. According to an embodiment, the middle substrate layer 155 can be made using the same material as the substrate 199 (e.g., a p-type substrate). According to another embodiment, the middle substrate layer 155 can be made using the same material as the isolation layer 188 to be a deep n-type well (DNW).

Moreover, the memory device 100 can further include isolation structures 115 and 116, and the isolation structures 115 and 116 can be of shallow trench isolation (STI).

As shown in FIG. 1, the poly layer P1 can have a first part P11 partially overlapped with the active area A1, a second part P12 connected with the first part P11 and partially overlapped with the well W1 and the well W2, and a third part P13 connected with the second part P12 and partially overlapped with the active area A2.

Assuming the first conductivity type and the second conductivity type are respectively n-type and p-type, during the program operation, a lower voltage (e.g., zero volts) can be applied as the voltage VW2, and a higher voltage (e.g., 8 volts) can be applied as the voltages VSL and VW1. Because the area AR2 for the coupling between the well W2 and the poly layer P1 (i.e. floating gate) is large enough, an equivalent transistor (e.g., the transistor T in FIG. 2) can be better turned on, and the problem of stuck-bit can be effectively avoided.

Regarding the erase operation, a higher voltage (e.g., 16 volts) can be applied as the voltage VW1 to pull out the electrons stored in the floating gate (i.e. the poly layer P1).

During the erase operation, the electrons can be pulled out from the floating gate (i.e. the poly layer P1) to the active area D1 via the path PT shown in FIG. 2. Since the active area D1 can be formed below the floating gate (e.g., the poly layer P1) instead of being at the edge of the floating gate, the standard F-N tunneling mechanism can be used for the erase operation rather than the edge F-N tunneling mechanism. Hence, the efficiency of the erase operation can be improved.

Regarding the middle substrate layer 155, if the junction breakdown voltage between the well W1 and the well W2 is high enough, such as being higher than the voltage VW1 (i.e. the voltage VEE described below) used for the erase operation, the middle substrate layer 155 can be shrunken or even omitted. Hence, the middle substrate layer 155 between the wells is less limited by the design rules, and the size of the memory device 100 can therefore be reduced.

Figure 3:
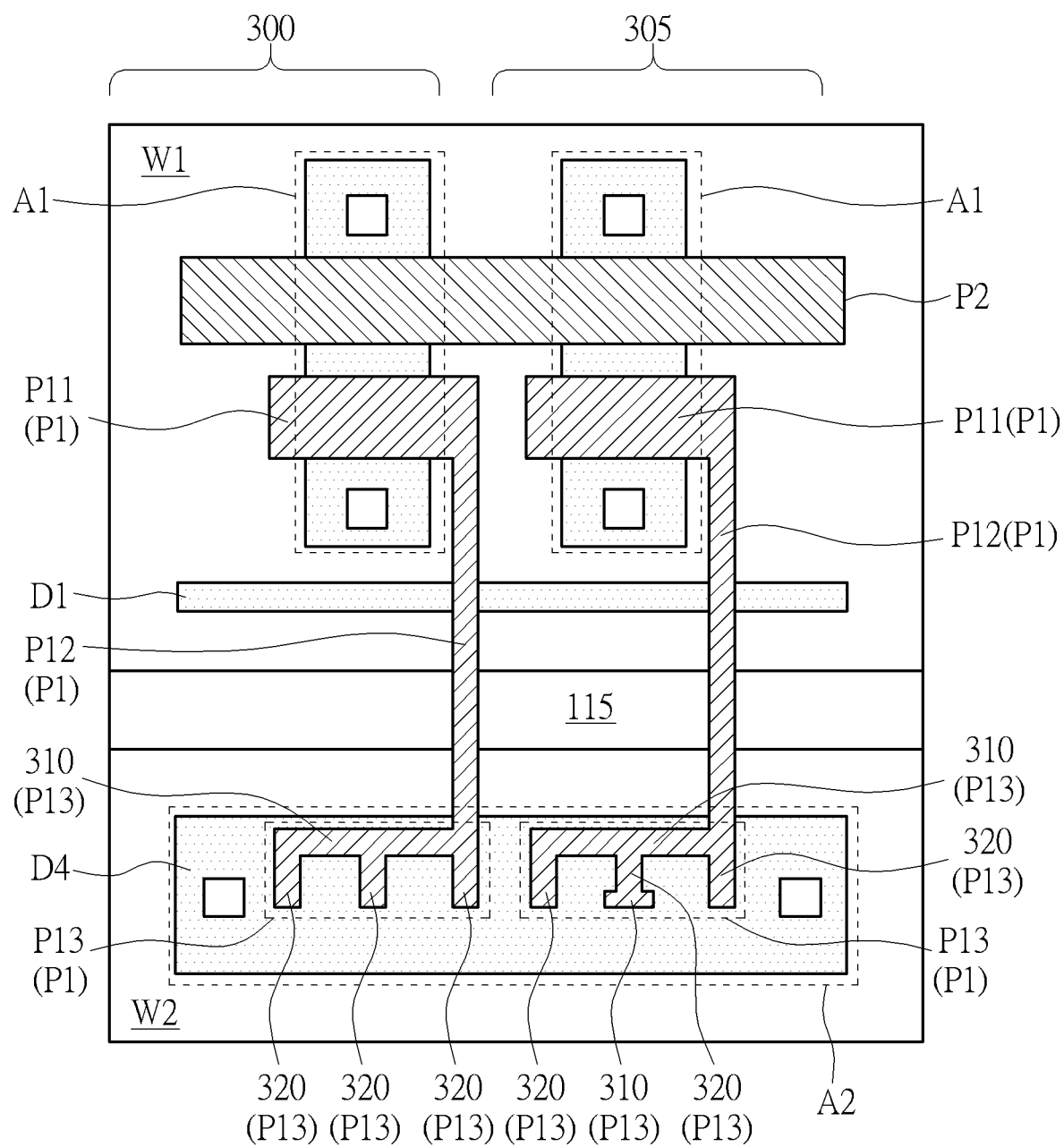
FIG. 3 illustrates a top view of memory devices according to another embodiment.

FIG. 3 illustrates a top view of memory devices 300 and 305 according to another embodiment. In FIG. 3, two memory devices are shown; however, FIG. 3 is merely an example, and embodiments are not limited thereto. According to embodiments, more than two memory devices can be disposed to form an array by means of the structure disclosed in FIG. 3. As shown in FIG. 3, the memory devices 300 and 305 can share some layers such as the poly layer P2, the active area D1, the active area A2 and so on. The memory devices 300 and 305 can be separately controlled. The memory devices 300 and 305 of FIG. 3 can be similar to the memory device 100 in FIG. 1; however, as shown in FIG. 3, the part P13 of the poly layer P1 can have at least one first sub-portion 310 and at least one second sub-portion 320, where the sub-portion 320 can be connected to the sub-portion 310 and be perpendicular to the sub-portion 310. In other words, as shown in FIG. 3, the shape of the part P13 of the poly layer P1 can be like a fork. If complying with the design rules, a smaller the sub-portion 310 can be formed at the end of the sub-portion 320 as shown in the memory device 305.

By adjusting the part P13 of the poly layer P1 to have a fork shape as shown in FIG. 3, the perimeter of the part of poly layer P1 overlapped with the active area A2 can be increased, and the doping of the active area A2 can be less blocked by the poly layer P1. The coupling ratio between the active are A2 and the poly layer P1 can be improved. As a result, the efficiency of the program operation can be enhanced.

Figure 4:
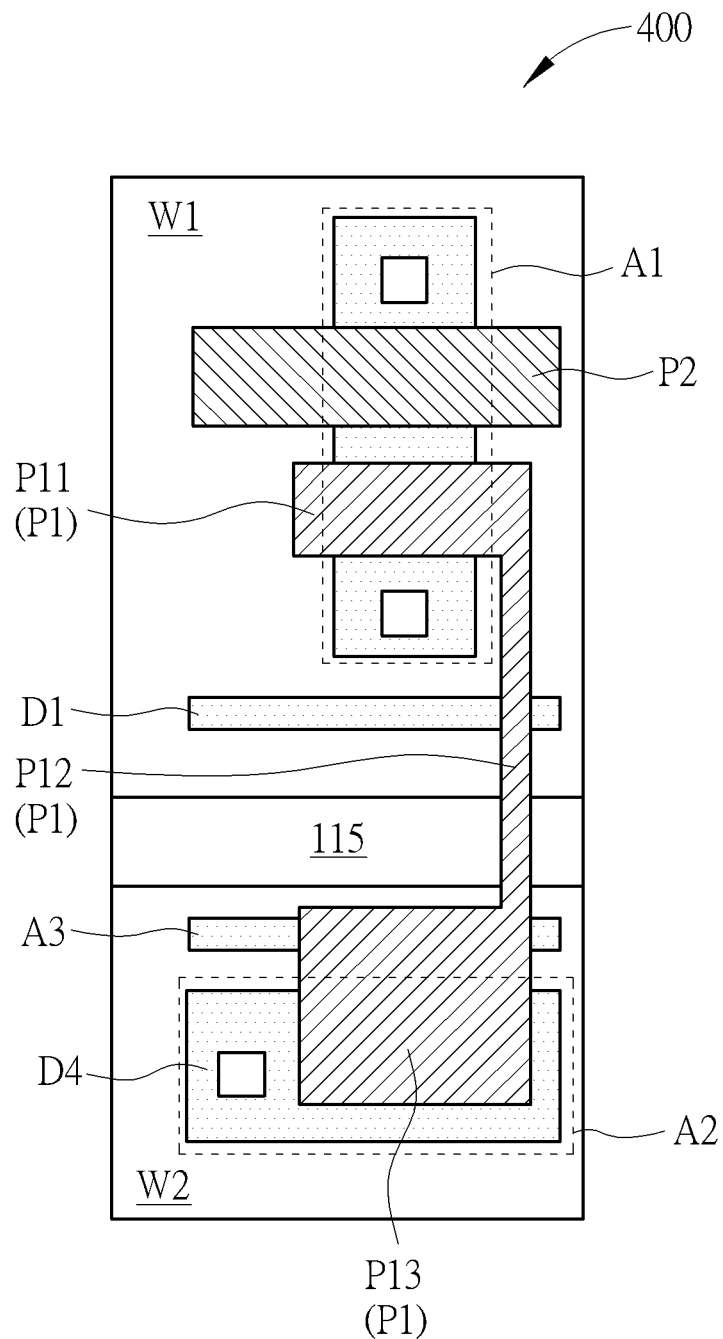
FIG. 4 illustrates a memory device according to another embodiment.

FIG. 4 illustrates a memory device 400 according to another embodiment. The memory device 400 can be similar to the memory device 100 of FIG. 1; however, the memory device 400 can further include an active area A3 of the second conductivity type (e.g., p-type) formed on the well W2 and partially overlapped with the poly layer P1. During the erase operation, a lower voltage (e.g., zero volts) can be applied to the active area A3 to better pull out the electrons from the floating gate (i.e., the poly layer), and the efficiency of the erase operation can be improved.

Figure 5:
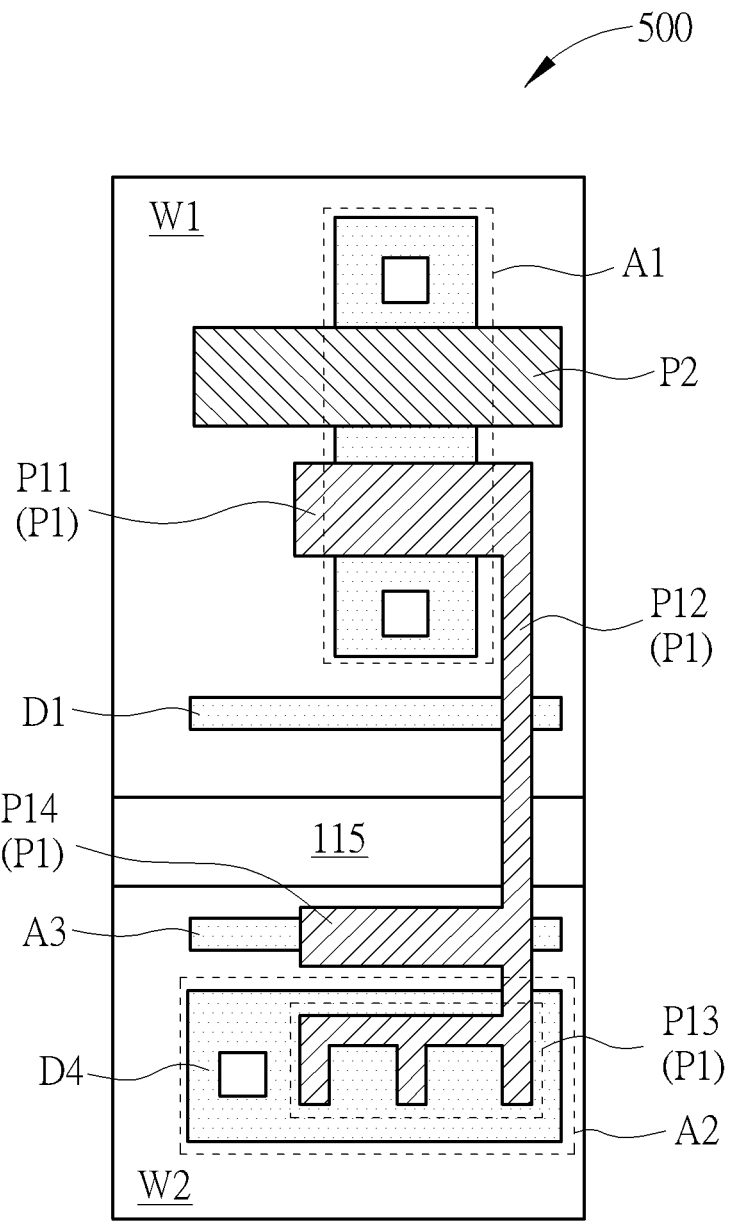
FIG. 5 illustrates a memory device according to another embodiment.

FIG. 5 illustrates a memory device 500 according to another embodiment. As shown in FIG. 5, the fork shape of the part P13 of the poly layer P1 overlapped with the active area A2 (as mentioned in FIG. 3) and the active area A3 can be used to improve the efficiency of the program operation and the erase operation. In addition, the part of the poly layer P1 overlapped with the active area A3 can be enlarged as the part P14 of FIG. 5 so as to further improve the efficiency of the erase operation.

Table-1 describes the operations of the memory devices 100, 300, 305, 400 and 500 mentioned above.

| Voltages | Program operation | Erase operation | Read operation |
|---|---|---|---|
| VSL (applied to the doped region D2 and the source line) | Vpp (e.g., 8 volts) | Vee/2 (e.g., 8 volts) | Vrd (e.g., 2.4 volts) |
| VWL (applied to the poly layer P2 and the word line) | *A voltage lower than VSL (e.g., a voltage of a range from zero volts to 8 volts) | Vee/2 (e.g., 8 volts) | *Low voltage (e.g., zero volts) |
| VBL (applied to the doped region D3 and the bit line) | Low voltage (e.g., zero volts) | Vee/2 (e.g., 8 volts) | Low voltage (e.g., zero volts) |
| VCL (applied to the doped region D4 and the couple line) | Ramping (e.g., from zero volts to Vpp/2, or from zero volts to Vpp) | Low voltage (e.g., zero volts) | *A voltage between the low voltage to the read voltage Vrd (e.g., a voltage of a range from zero volts to 2.4 volts) |
| VW1 (applied to the well W1) | Vpp (e.g., 8 volts) | Vee (e.g., 16 volts) | Vrd (e.g., 2.4 volts) |
| VW2 (applied to the well W2) | Low voltage (e.g., zero volts) | Low voltage (e.g., zero volts) | Low voltage (e.g., zero volts) |

(Table-1, the voltage marked with an asterisk (*) can be fine-tuned)

Regarding the Program Operation:

During the program operation, as shown in Table-1, the well W1 and the doped region D2 can receive a program voltage Vpp. The poly layer P2 (e.g., the select gate coupled to the word line) can receive a half of the voltage Vpp, that is Vpp/2.

According to embodiments, the voltage VWL can be fine-tuned to adjust the degree of turning on the transistor of the memory device. The voltage VWL can be set lower than the voltage VSL and be of a range from the low voltage to the voltage Vpp. For example, the voltage VWL can be adjusted to be zero volts.

The doped region D3 and the well W2 can receive the low voltage (e.g., zero volts).

The doped region D4 can receive a voltage ramping from a first level to a second level. For example, the first level can be substantially equal to the low voltage (e.g., zero volts), and the second level can be substantially equal to the voltage Vpp or a half of the voltage Vpp, that is Vpp/2. A waveform of the voltage ramping from the first level to the second level can include a linearly rising waveform, a ladder waveform and/or a curvy waveform. For example, the voltage VCL can be zero volts for 20 microseconds to turn on the transistor, and then the voltage VCL can be Vpp/2 for 30 microseconds to make the floating gate attract more electrons.

Regarding the Erase Operation:

During the erase operation, as shown in Table-1, the well W1 can receive an erase voltage Vee. The doped region D2, the poly layer P2 and the doped region D3 can receive a half of the voltage Vee, that is Vee/2. The well W2 and the doped region D4 can receive a low voltage (e.g., zero volts). By means of the said voltages, and the electrons can be pulled out from the poly layer P1 (e.g., floating gate) with the standard F-N tunneling mechanism.

Regarding the Read Operation:

During the read operation, as shown in Table-1, the well W1 and the doped region D2 can receive a read voltage Vrd. The poly layer P2, the doped region D3 and the well W2 can receive a low voltage (e.g., zero volts). The doped region D4 can receive the voltage VCL. According to embodiment, the voltage VWL and the voltage VCL can be fine-tuned to adjust the read current to better read the memory device. For example, the voltage VCL can be of a range from the low voltage to the read voltage Vrd (e.g., 0 to 2.4 volts).

In summary, by means of the memory devices provided by embodiments, the program operation of channel hot-electron injection (CHEI) can be performed, and the stuck-bit problem can be reduced. The efficiency of erase can be improved since the standard F-N tunneling can be used instead of edge F-N tunneling. A high voltage for the erase operation can be applied to the junction between the well W1 and the middle substrate layer 155 or the junction between the well W1 and the well W2, and the device can sustain the higher bias voltage and consume lower leakage current. The voltage VCL can be adjusted to modulate the read current. The coupling ratio can be increased by means of the foresaid fork shape so as to improve the efficiency of the program operation. The active area A3 can improve the efficiency of the erase operation. Suitable isolation layer such as n-type buried layer (NBL), deep n-type well (DNW) or n-type substrate (n-sub) can be used to isolate noise signals while the punch-through problems are prevented. In short, a plurality of memory-related characteristics can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory device comprising:
   a first well of a first conductivity type;
   a second well of a second conductivity type different from the first conductivity type;
   a first active area of the second conductivity type formed on the first well;
   a second active area of the first conductivity type formed on the first well and between the first active area and the second well;
   a third active area of the first conductivity type formed on the second well;
   a first poly layer formed above the first well and the second well; and
   a second poly layer formed above the first well;
   wherein a first overlap area of the first poly layer and the second active area is smaller than a second overlap area of the first poly layer and the third active area.

2. The memory device of claim 1, further comprising:
   an isolation layer formed below the first well and the second well;
   wherein the isolation layer comprises a buried layer of the first conductivity type, a deep well of the first conductivity type and/or a substrate of the second conductivity type.

3. The memory device of claim 2, further comprising:
a substrate of the second conductivity type formed below the isolation layer.

4. The memory device of claim 1, further comprising:
a middle substrate layer formed between the first well and the second well and configured to increase a junction breakdown voltage between the first well and the second well.

5. The memory device of claim 1, wherein the first poly layer comprises a first part partially overlapped with the first active area, a second part connected with the first part and partially overlapped with the first well and the second well, and a third part connected with the second part and partially overlapped with the third active area.

6. The memory device of claim 5, wherein the third part of the first poly layer comprises a first sub-portion and a second sub-portion connected to the first sub-portion and being perpendicular to the first sub-portion.

7. The memory device of claim 1, further comprising:
a fourth active area of the second conductivity type formed on the second well and partially overlapped with the first poly layer;
wherein the fourth active area is configured to receive a low voltage during an erase operation.

8. The memory device of claim 1, wherein the first active area comprises a first doped region and a second doped region of the second conductivity type, and the third active area comprises a third doped region of the first conductivity type.

9. The memory device of claim 8, wherein during a program operation:
the first well and the first doped region are configured to receive a first voltage;
the second poly layer is configured to receive a voltage lower than the first voltage;
the second doped region and the second well are configured to receive a low voltage; and
the third doped region is configured to receive a voltage ramping from a first level to a second level.

10. The memory device of claim 9, wherein the first level is substantially equal to the low voltage, and the second level is substantially equal to the first voltage or the half of the first voltage.

11. The memory device of claim 9, wherein a waveform of the voltage ramping from the first level to the second level comprises a linearly rising waveform, a ladder waveform and/or a curvy waveform.

12. The memory device of claim 8, wherein during an erase operation:
the first well is configured to receive a second voltage;
the first doped region, the second poly layer, and the second doped region are configured to receive a half of the second voltage; and
the second well and the third doped region are configured to receive a low voltage.

13. The memory device of claim 8, wherein during a read operation:
the first well and the first doped region are configured to receive a third voltage;
the second poly layer, the second doped region and the second well are configured to receive a low voltage; and
the third doped region is configured to receive a voltage of a range from the low voltage to the third voltage.

14. The memory device of claim 1, wherein the first conductivity type is an n-type, and the second conductivity type is a p-type.

* * * * *